United States Patent
Yu et al.

(10) Patent No.: US 10,269,702 B2
(45) Date of Patent: Apr. 23, 2019

(54) INFO COIL STRUCTURE AND METHODS OF MANUFACTURING SAME

(71) Applicant: Taiwan Semiconductor Manufacturing Company, Ltd., Hsin-Chu (TW)

(72) Inventors: Chen-Hua Yu, Hsin-Chu (TW); Tsung-Hsien Chiang, Hsin-Chu (TW); Hao-Yi Tsai, Hsin-Chu (TW); Hung-Yi Kuo, Taipei (TW); Ming Hung Tseng, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/254,671

(22) Filed: Sep. 1, 2016

(65) Prior Publication Data
US 2017/0221820 A1 Aug. 3, 2017

Related U.S. Application Data

(60) Provisional application No. 62/289,065, filed on Jan. 29, 2016.

(51) Int. Cl.
*H01L 21/48* (2006.01)
*H01L 21/56* (2006.01)
(Continued)

(52) U.S. Cl.
CPC ...... *H01L 23/5227* (2013.01); *H01L 21/4857* (2013.01); *H01L 21/563* (2013.01);
(Continued)

(58) Field of Classification Search
CPC .......... H01L 21/02118; H01L 21/4846; H01L 21/4853; H01L 21/56; H01L 21/76831; H01L 21/76832; H01L 21/76898; H01L 2224/18; H01L 2225/0651; H01L 23/3157; H01L 23/498; H01L 23/5223; H01L 23/5226; H01L 23/5227; H01L 23/5283; H01L 23/53238; H01L 25/0655; H01L 25/50; H01L 28/10; H01L 28/40;
(Continued)

(56) References Cited

U.S. PATENT DOCUMENTS

| | | |
|---|---|---|
| 5,652,173 A | 7/1997 | Kim |
| 8,361,842 B2 | 1/2013 | Yu et al. |

(Continued)

FOREIGN PATENT DOCUMENTS

| | | |
|---|---|---|
| CN | 102623391 A | 8/2012 |
| CN | 103681613 A | 3/2014 |

(Continued)

*Primary Examiner* — Mark W Tornow
*Assistant Examiner* — Priya M Rampersaud
(74) *Attorney, Agent, or Firm* — Slater Matsil, LLP

(57) ABSTRACT

A method includes forming a coil over a carrier, encapsulating the coil in an encapsulating material, planarizing a top surface of the encapsulating material until the coil is exposed, forming at least one dielectric layer over the encapsulating material and the coil, and forming a plurality of redistribution lines extending into the at least one dielectric layer. The plurality of redistribution lines is electrically coupled to the coil.

19 Claims, 20 Drawing Sheets

(51) Int. Cl.
*H01L 23/00* (2006.01)
*H01L 23/31* (2006.01)
*H01L 23/522* (2006.01)

(52) U.S. Cl.
CPC .......... *H01L 23/3114* (2013.01); *H01L 24/19* (2013.01); *H01L 24/20* (2013.01); *H01L 24/97* (2013.01); *H01L 21/568* (2013.01); *H01L 2224/04105* (2013.01); *H01L 2224/12105* (2013.01); *H01L 2224/19* (2013.01); *H01L 2224/24195* (2013.01); *H01L 2224/32225* (2013.01); *H01L 2224/73267* (2013.01); *H01L 2224/92244* (2013.01); *H01L 2224/97* (2013.01); *H01L 2924/10253* (2013.01); *H01L 2924/14* (2013.01); *H01L 2924/18162* (2013.01); *H01L 2924/19011* (2013.01); *H01L 2924/19041* (2013.01); *H01L 2924/19042* (2013.01); *H01L 2924/19043* (2013.01); *H01L 2924/19105* (2013.01)

(58) Field of Classification Search
CPC ......... H01L 2924/0002; H01L 2924/00; H01L 21/76838; H01L 27/0605; H01L 28/24; H01L 21/2855; H01L 21/6836; H01L 23/552; Y10S 438/97; C23C 14/50; C23C 14/54; H01F 2027/2809; H01F 27/2804; H01F 27/362; H01F 38/14; H05K 1/185
See application file for complete search history.

(56) References Cited

U.S. PATENT DOCUMENTS

| | | |
|---|---|---|
| 8,476,120 B2 | 7/2013 | Huang et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,343,442 B2 | 5/2016 | Chen et al. |
| 9,368,563 B2 | 6/2016 | Lin et al. |
| 9,513,246 B2 | 12/2016 | O'Donnell et al. |
| 9,543,278 B2 | 1/2017 | Hsiao et al. |
| 9,726,518 B2 | 8/2017 | Widmer et al. |
| 2005/0212641 A1* | 9/2005 | Hung .................... H01F 41/041 336/200 |
| 2011/0042782 A1* | 2/2011 | Chao ...................... H01L 28/10 257/531 |
| 2011/0241793 A1 | 10/2011 | Frye et al. |
| 2011/0291288 A1 | 12/2011 | Wu et al. |
| 2012/0161279 A1* | 6/2012 | Lin ....................... H01L 21/561 257/531 |
| 2012/0168963 A1 | 7/2012 | Huang et al. |
| 2012/0313210 A1* | 12/2012 | Miyatake ............. H01L 31/105 257/443 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0207230 A1 | 8/2013 | Jin et al. |
| 2013/0307140 A1 | 11/2013 | Huang et al. |
| 2014/0015522 A1* | 1/2014 | Widmer ................ G01D 5/2006 324/239 |
| 2014/0035630 A1* | 2/2014 | O'Donnell ............. H01L 25/16 327/109 |
| 2014/0076617 A1* | 3/2014 | Chen .................... H01L 25/105 174/255 |
| 2014/0203429 A1 | 7/2014 | Yu et al. |
| 2014/0210101 A1* | 7/2014 | Lin ........................ H01L 24/19 257/774 |
| 2014/0225222 A1 | 8/2014 | Yu et al. |
| 2014/0252646 A1 | 9/2014 | Hung et al. |
| 2014/0264930 A1 | 9/2014 | Yu et al. |
| 2014/0284777 A1* | 9/2014 | Otremba .......... H01L 23/49513 257/666 |
| 2015/0228416 A1 | 8/2015 | Hurwitz et al. |
| 2015/0282308 A1* | 10/2015 | Meyer .................... H05K 1/181 361/729 |
| 2015/0326056 A1* | 11/2015 | Koyanagi ............... H02J 7/025 320/108 |

FOREIGN PATENT DOCUMENTS

| | | |
|---|---|---|
| CN | 104521151 A | 4/2015 |
| DE | 69735919 T2 | 3/2007 |
| JP | 2015533273 A | 11/2015 |
| KR | 20120071360 A | 7/2012 |
| KR | 20140038283 A | 3/2014 |
| TW | 201041084 A | 11/2010 |

\* cited by examiner

US 10,269,702 B2

INFO COIL STRUCTURE AND METHODS OF MANUFACTURING SAME

PRIORITY CLAIM AND CROSS-REFERENCE

This application claims the benefit of the following provisionally filed U.S. Patent application: Application Ser. No. 62/289,065, filed Jan. 29, 2016, and entitled "InFO Coil Structure and Methods of Manufacturing Same;" which application is hereby incorporated herein by reference.

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to the region directly over the surface of the respective die. With the limited areas of the dies, the number of the I/O pads is limited due to the limitation of the pitch of the I/O pads. If the pitch of the pads is to be decreased, solder regions may bridge with each other, causing circuit failure. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that only "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
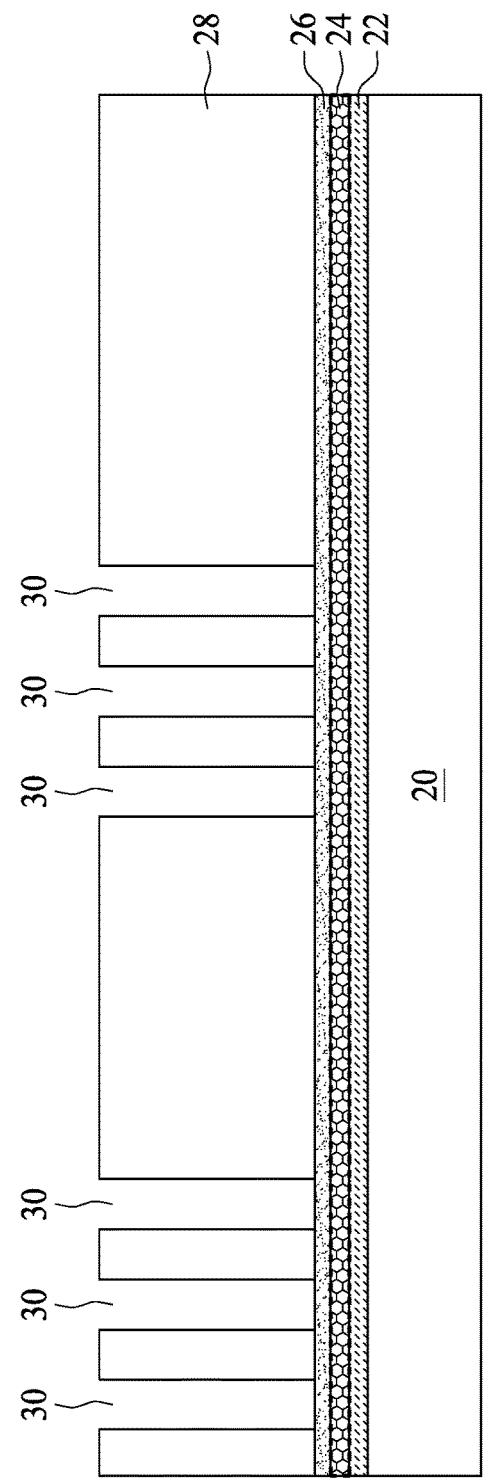
FIGS. 1 through 13 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package including a coil penetrating through an encapsulating material of the respective package and the method of forming the package are provided in accordance with various exemplary embodiments. The intermediate stages of forming the package are illustrated. Some variations of some embodiments are discussed. Throughout the various views and illustrative embodiments, like reference numbers are used to designate like elements.

Figure 18:
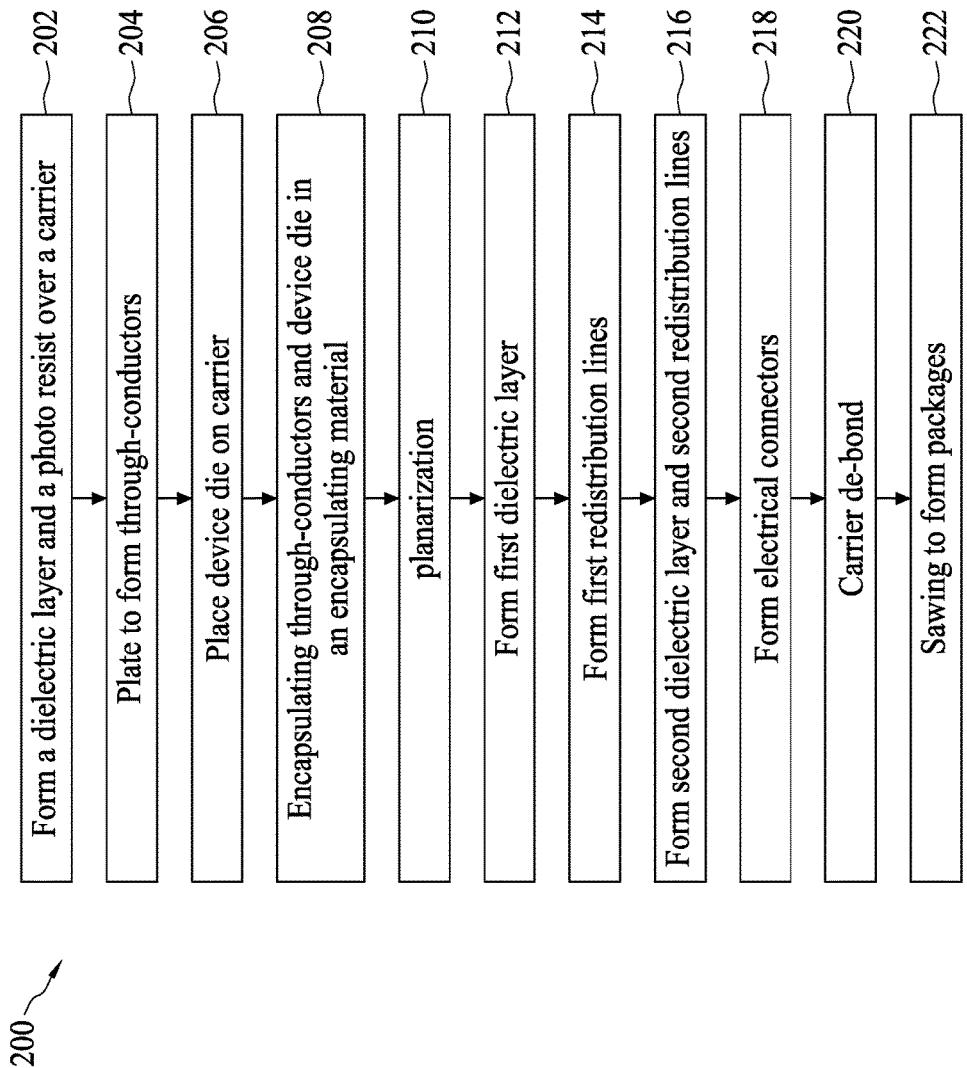
FIG. 18 illustrates a process flow for forming a package in accordance with some embodiments.

FIGS. 1 through 13 illustrate the cross-sectional views and top views of intermediate stages in the formation of some packages in accordance with some embodiments of the present disclosure. The steps shown in FIG. 1 through 13 are also schematically illustrated in the process flow 200 shown in FIG. 18.

FIG. 1 illustrates carrier 20 and release layer 22 formed over carrier 20. Carrier 20 may be a glass carrier, a ceramic carrier, or the like. Carrier 20 may have a round top-view shape, and may have a size of a silicon wafer. For example, carrier 20 may have an 8-inch diameter, a 12-inch diameter, or the like. Release layer 22 may be formed of a polymer-based material (such as a Light To Heat Conversion (LTHC) material), which may be removed along with carrier 20 from the overlying structures that will be formed in subsequent steps. In accordance with some embodiments of the present disclosure, release layer 22 is formed of an epoxy-based thermal-release material. In accordance with some embodiments of the present disclosure, release layer 22 is formed of an ultra-violet (UV) glue. Release layer 22 may be dispensed as a liquid and cured. In accordance with alternative embodiments of the present disclosure, release layer 22 is a laminate film and is laminated onto carrier 20. The top surface of release layer 22 is leveled and has a high degree of planarity.

In accordance with some embodiments of the present disclosure, dielectric layer 24 is formed over release layer 22. The respective step is shown as step 202 in the process flow shown in FIG. 18. In the final product, dielectric layer 24 may be used as a passivation layer to isolate the overlying metallic features from the adverse effect of moisture and other detrimental substances. Dielectric layer 24 may be formed of a polymer, which may also be a photo-sensitive material such as polybenzoxazole (PBO), polyimide, benzocyclobutene (BCB), or the like. In accordance with alternative embodiments of the present disclosure, dielectric layer 24 is formed of an inorganic material(s), which may be a nitride such as silicon nitride, an oxide such as silicon oxide, PhosphoSilicate Glass (PSG), BoroSilicate Glass (BSG), Boron-doped PhosphoSilicate Glass (BPSG), or the like. In accordance with yet alternative embodiments of the present disclosure, no dielectric layer 24 is formed. Accordingly, dielectric layer 24 is shown with dashed lines to indicate that it may or may not be formed.

Figure 2:
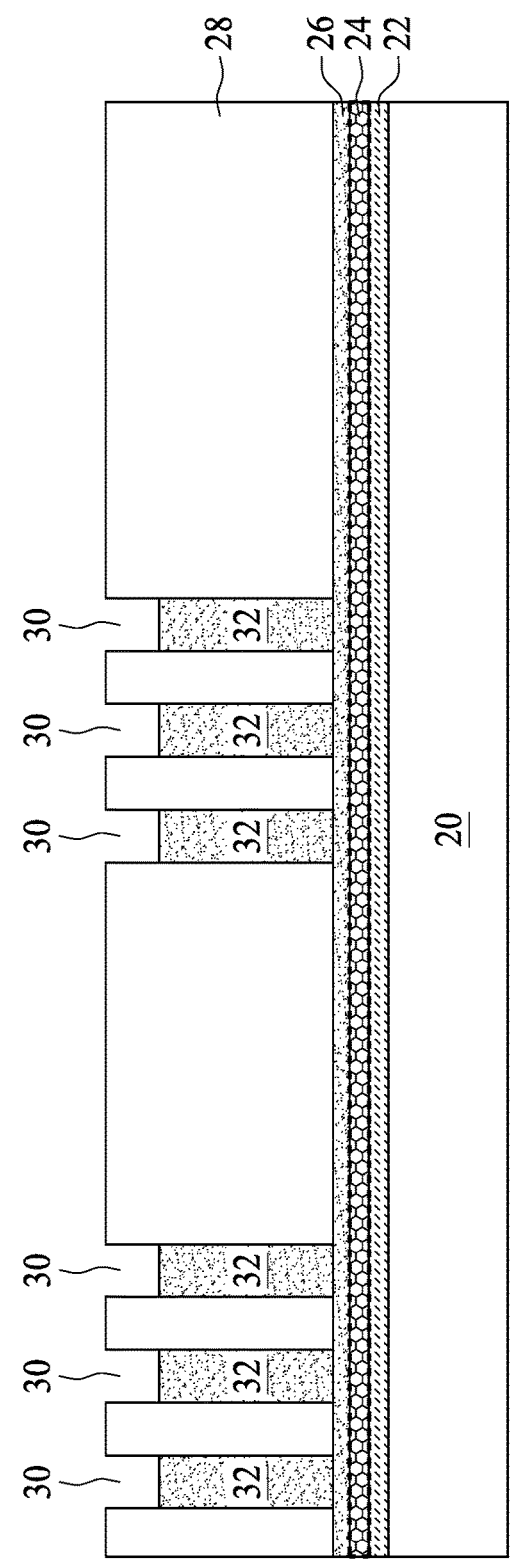
Figure 3:
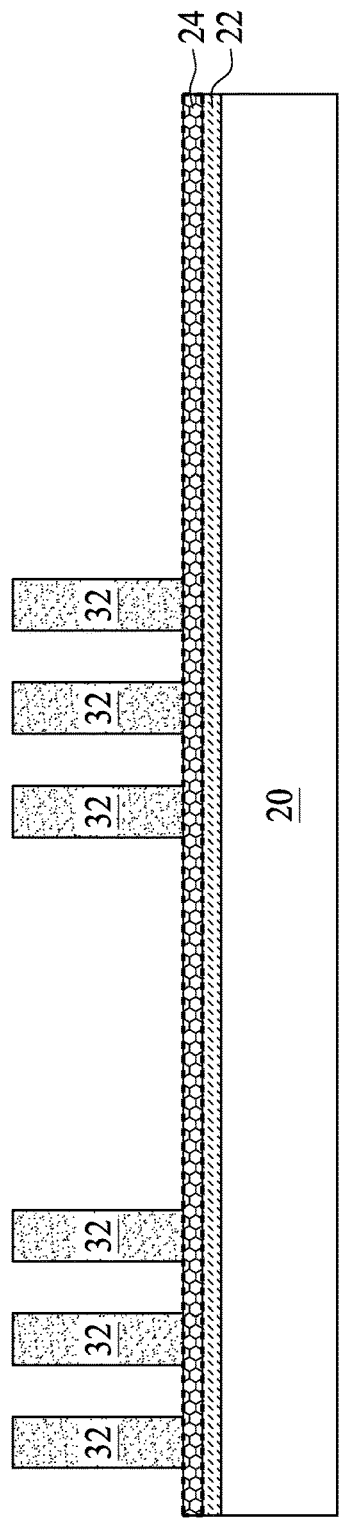

FIGS. 2 and 3 illustrate the formation of conductive features 32, which are referred to as through-conductors (or through-vias) hereinafter since they penetrate the encapsulation material 52 (FIG. 6) that will be applied in subsequent steps. Referring to FIG. 2, seed layer 26 is formed over dielectric layer 24, for example, through Physical Vapor Deposition (PVD) or metal foil lamination. Seed layer 26 may be formed of copper, aluminum, titanium, or multi-layers thereof. In accordance with some embodiments of the present disclosure, seed layer 26 includes a titanium layer (not shown) and a copper layer (not shown) over the titanium layer. In accordance with alternative embodiments, seed layer 26 includes a single copper layer.

Photo resist 28 is applied over seed layer 26 and is then patterned. The respective step is also shown as step 202 in the process flow shown in FIG. 18. As a result, openings 30 are formed in photo resist 28, through which some portions of seed layer 26 are exposed.

As shown in FIG. 2, through-conductors 32 are formed in openings 30 through plating, which may be a suitable combination of electro plating and electro-less plating. The respective step is shown as step 204 in the process flow shown in FIG. 18. Through-conductors 32 are plated on the exposed portions of seed layer 26. Through-conductors 32 may include copper, aluminum, tungsten, nickel, or alloys thereof. The top-view pattern profile/shape of through-conductors 32 include, and are not limited to, spirals, rings, rectangles, squares, circles, and the like, depending on the intended function of through-conductors 32. Although through-conductors 32 are illustrated as discrete features in the cross-sectional views throughout the description, they may be parts of an integral conductor. The heights of through-conductors 32 are determined by the thickness of the subsequently placed device die 38 (FIG. 6), with the eventual heights of through-conductors 32 being greater than or equal to the thickness of device die 38 in accordance with various embodiments. The instant exemplary through-conductor 32 is configured to function as an inductor, and the heights of through-conductors 32 may be determined in accordance with the desirable inductance of the inductor formed thereby. In accordance with some embodiments, middle width W2 measured at the mid-height is greater than the top width W1 and bottom width W3. In accordance with alternative embodiments, top width W1 is greater than middle width W2, and middle width W2 is greater than bottom width W3.

After the plating of through-conductors 32, photo resist 28 is removed, and the resulting structure is shown in FIG. 3. The portions of seed layer 26 (FIG. 2) that were previously covered by photo resist 28 are exposed. An etch step is then performed to remove the exposed portions of seed layer 26, wherein the etching may be an anisotropic or isotropic etching. The portions of seed layer 26 that are overlapped by through-conductors 32, on the other hand, remain not etched. Throughout the description, the remaining underlying portions of seed layer 26 are considered as the bottom portions of through-conductors 32. When seed layer 26 is formed of a material similar to or the same as that of the respective overlying through-conductors 32, seed layer 26 may be merged with through-conductors 32 with no distinguishable interface therebetween. Accordingly, seed layers 26 are not shown in subsequent drawings. In accordance with alternative embodiments of the present disclosure, there exist distinguishable interfaces between seed layer 26 and the overlying plated portions of through-conductors 32.

Figure 14:
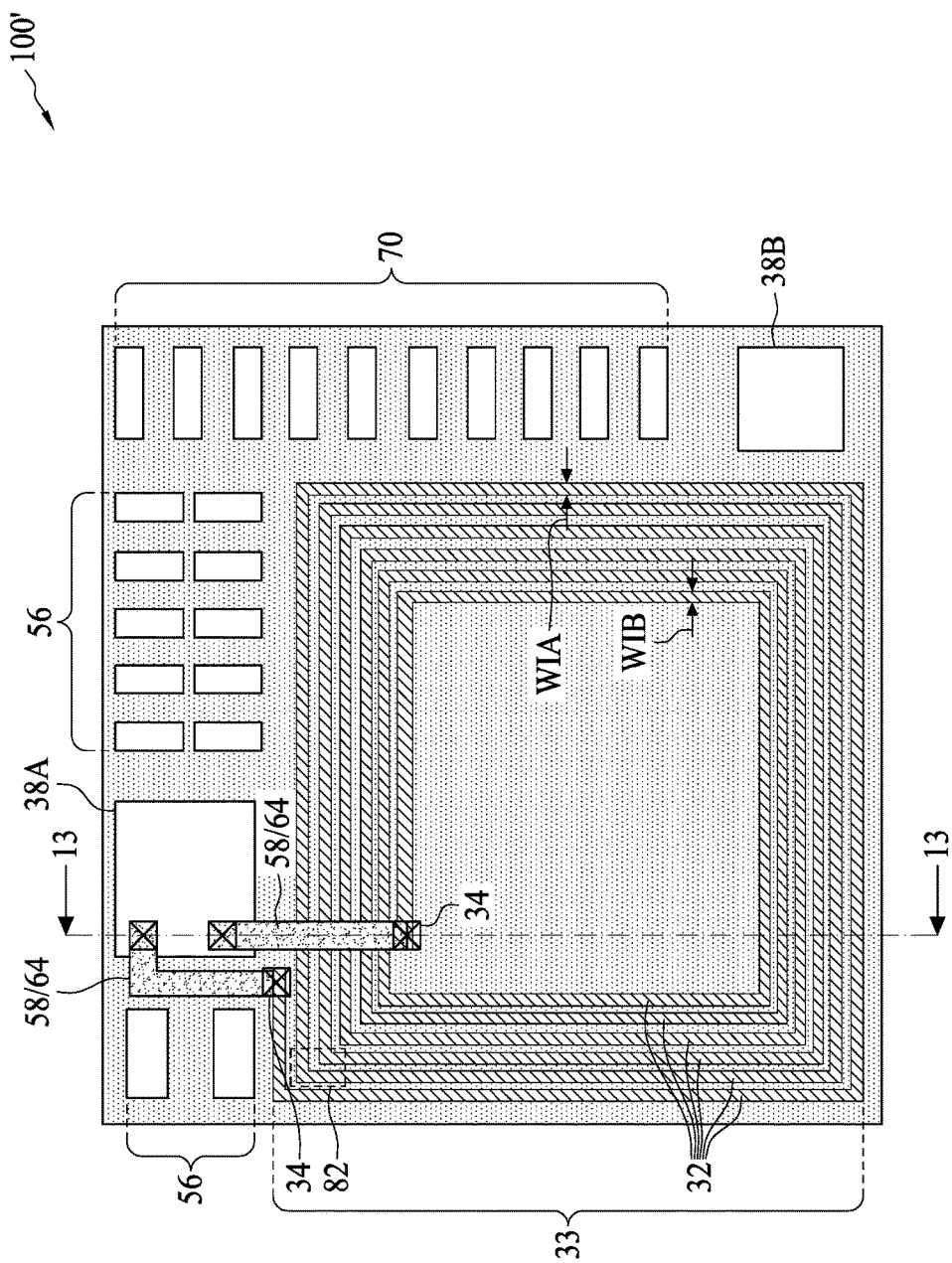
FIG. 14 illustrates a top view of a package including a coil, device dies, and passive devices in accordance with some embodiments.
Figure 16:
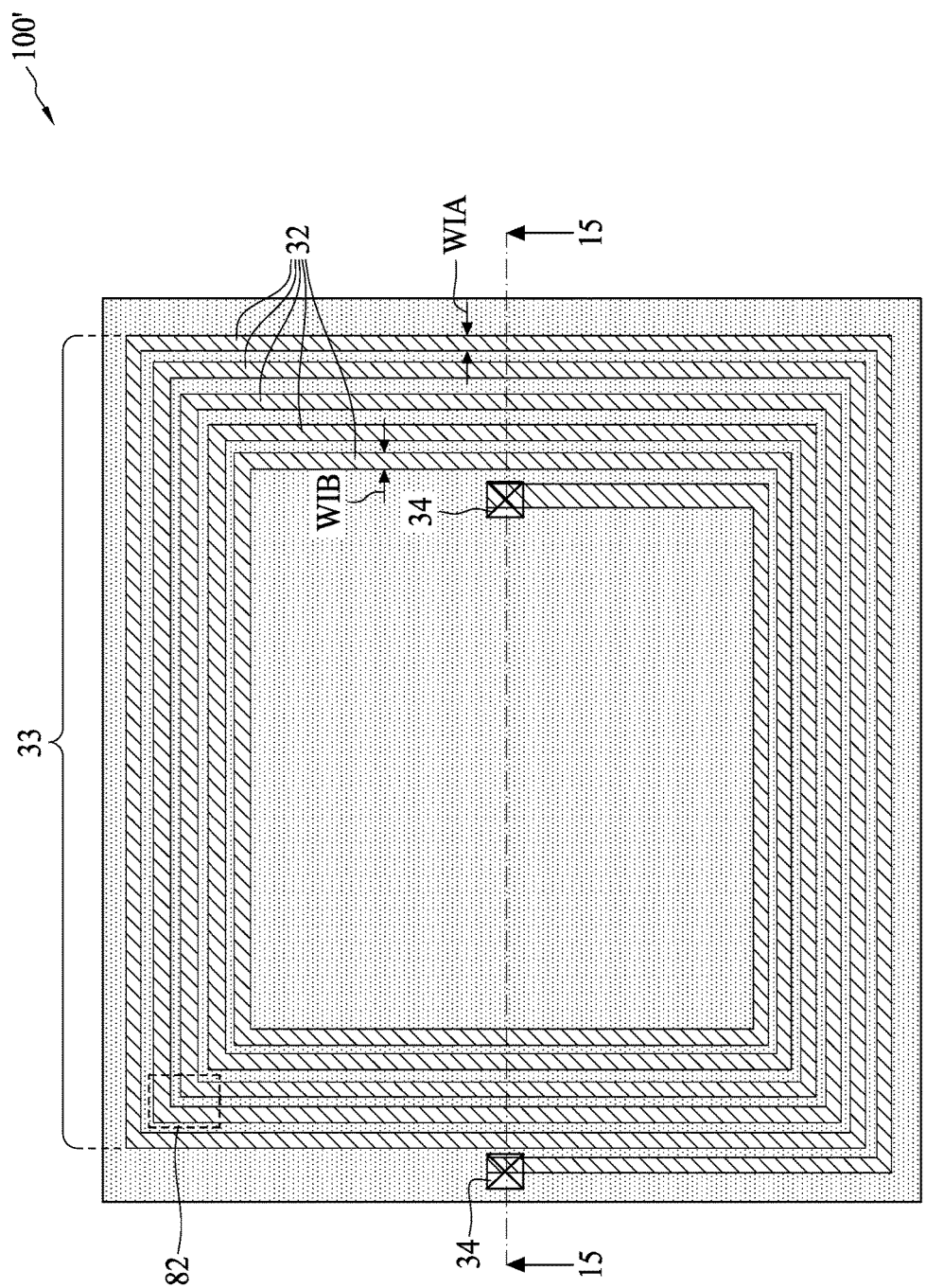
FIG. 16 illustrates a top view of a package including a coil and no device die in accordance with some embodiments.

The top-view shape of through-conductors 32 is related to, and is determined by, their intended function. In accordance with some exemplary embodiments in which through-conductors 32 are used to form an inductor, the illustrated through-conductors 32 may be a part of coil 33. In accordance with some embodiments, through-conductors 32 form a plurality of concentric rings (not shown), with the outer rings encircling the inner rings. The rings have breaks to allow the outer rings to be connected to the inner rings through the subsequently formed redistribution lines. In accordance with some embodiment, as shown in FIGS. 14 and 16, through-conductors 32 are portions of an integrated spiral forming coil 33, which also includes outer rings encircling inner rings. Coil 33 has ports 34 at the opposite ends of coil 33.

Figure 4:
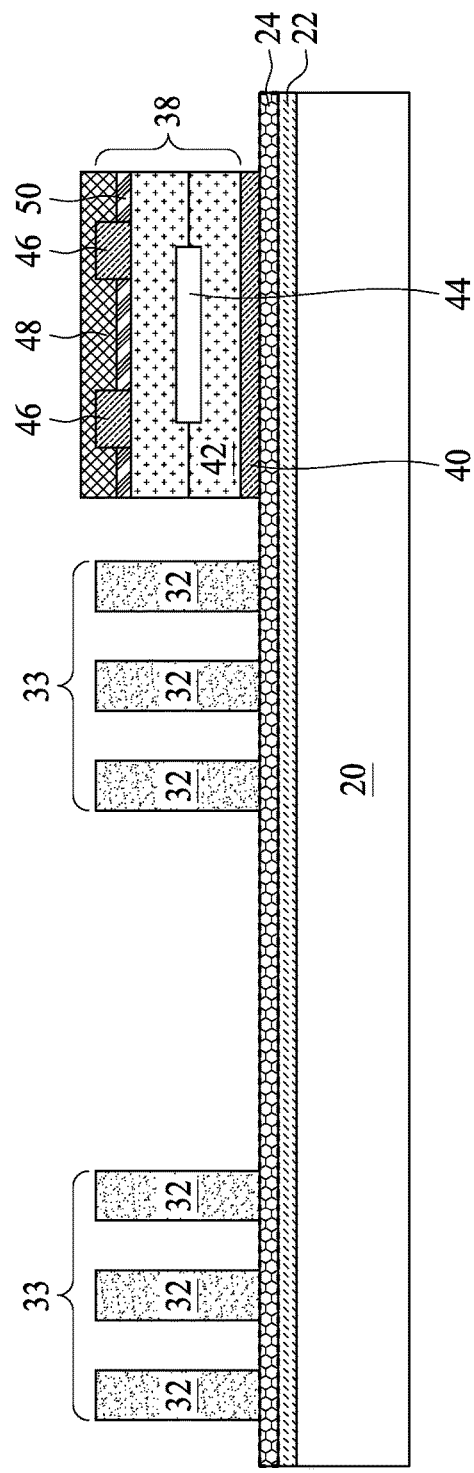

FIG. 4 illustrates the placement of device die 38(s) over carrier 20 in accordance with some embodiments of the present disclosure. The respective step is shown as step 206 in the process flow shown in FIG. 18. Device die 38 may be adhered to dielectric layer 24 through Die-Attach Film (DAF) 40, which is an adhesive film. In accordance with some embodiments of the present disclosure, device die 38 is an AC-DC converter die, which is arranged to perform the function of receiving the AC current from coil 33, and converting the AC current to a DC current. The DC current is used to charge a battery (not shown), or to drive circuits of the respective product, in which the package including coil 33 is located. Device die 38 may also be a communication die, which may be Bluetooth Low-Energy (BLE) die. The BLE die 38 may have the function of communicating with a transmitter (not shown), for example, through Bluetooth technology. The transmitter and BLE die 38 may negotiate the transmission of energy, for example, when the distance between the transmitter and coil 33 is small enough, and/or when the stored power in the battery is lower than a pre-determined threshold level. The transmitter may than start transmitting energy, which may be in the form of magnetic field at a high frequency, for example, at about 6.78 MHz. Coil 33 receives the energy, and feed the respective current to AC-DC converter die 38. In accordance with some embodiments of the present disclosure, device die 38 represents both AC-DC converter die and a BLE die.

Although one device die 38 is illustrated, more device dies may be placed over dielectric layer 24. In accordance with some embodiments of the present disclosure, the formation of the package is at wafer-level. Accordingly, a plurality of device dies identical to device die 38 may be placed on carrier 20, and is allocated as an array having a plurality of rows and columns. Similarly, a plurality of coils identical to coil 33 is formed simultaneously when coil 33 is formed.

Device die 38 may include semiconductor substrate 42, which may be a silicon substrate. Integrated circuit devices 44 are formed on semiconductor substrate 42. Integrated circuit devices 44 may include active devices such as transistors and diodes and/or passive devices such as resistors, capacitors, inductors, or the like. Device die 38 may include metal pillars 46 electrically coupled to integrated circuit devices 44. Metal pillars 46 may be embedded in dielectric layer 48, which may be formed of PBO, polyimide, or BCB, for example. Passivation layer 50 is also illustrated, wherein metal pillars 46 may extend into passivation layer 50. Passivation layer 50 may include silicon nitride, silicon oxide, or multi-layers thereof.

Figure 5:
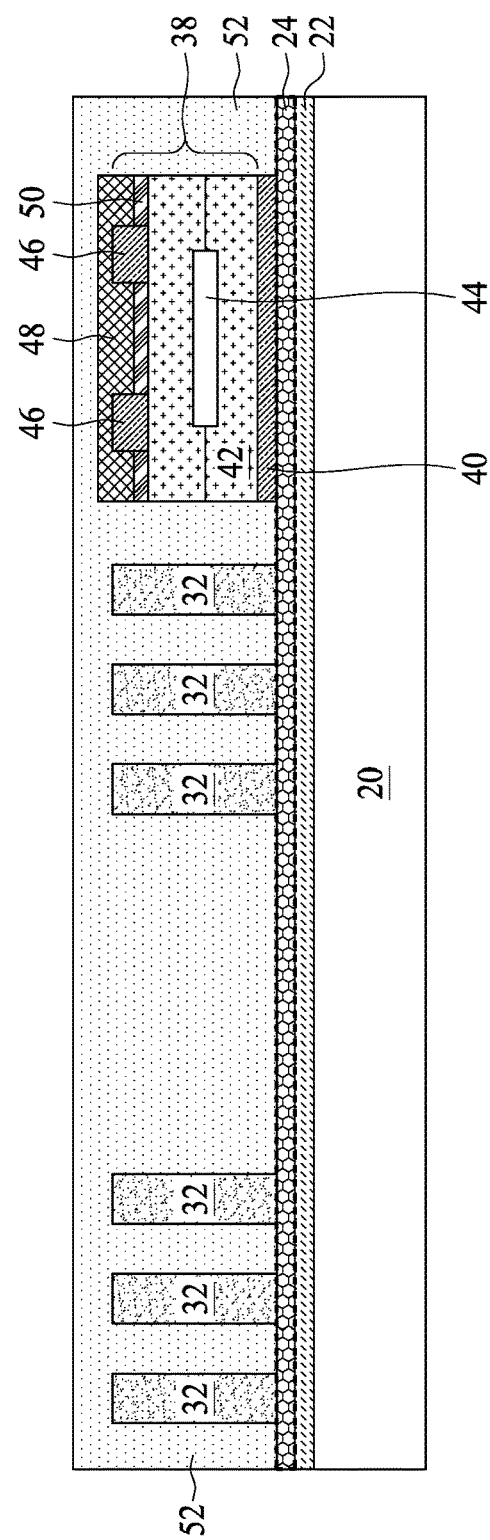

Next, referring to FIG. 5, encapsulating material 52 is encapsulated/molded on device die 38. The respective step is shown as step 208 in the process flow shown in FIG. 18. Encapsulating material 52 fills the gaps between neighboring through-conductors 32 and the gaps between through-conductors 32 and device die 38. Encapsulating material 52 may include a polymer-based material, and may include a molding compound, a molding underfill, an epoxy, and/or a resin. In accordance with some embodiments of the present disclosure, encapsulating material 52 includes an epoxy-based material and filler particles in the epoxy-based material. The filler particles may include, for example, $Al_2O_3$ particles, which may be spherical particles. The top surface of encapsulating material 52 is higher than the top ends of metal pillar 46.

Figure 6:
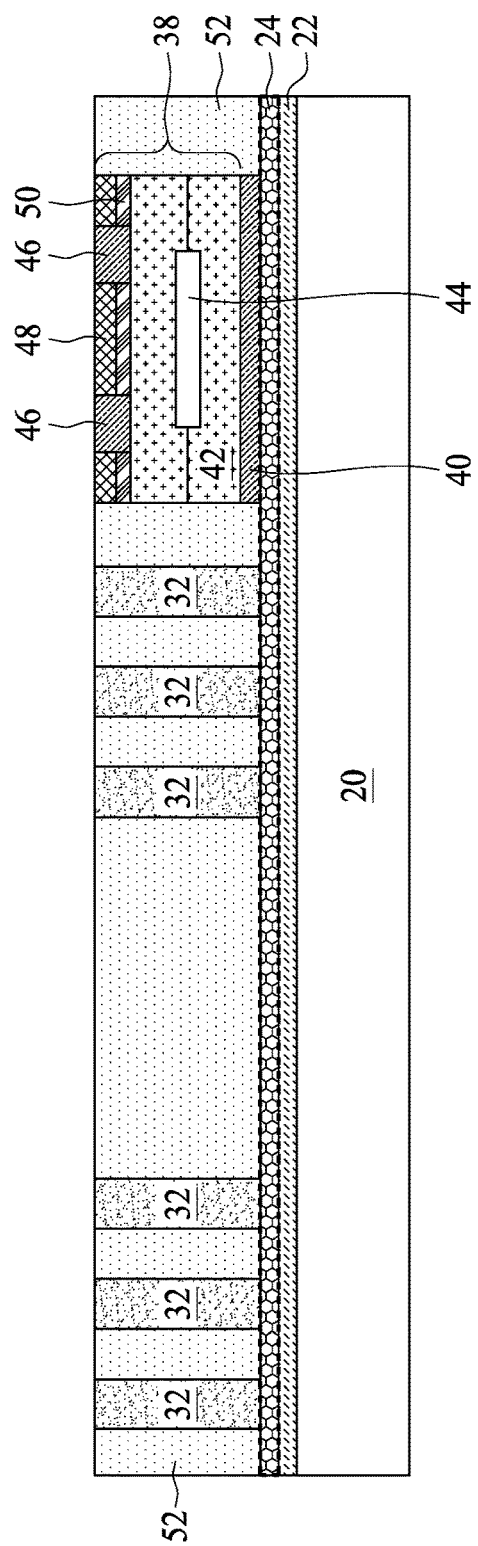

In a subsequent step, as shown in FIG. 6, a planarization process such as a Chemical Mechanical Polish (CMP) process or a grinding process is performed to reduce the top surface of encapsulating material 52, until through-conductors 32 and metal pillar 46 are exposed. The respective step is also shown as step 210 in the process flow shown in FIG. 18. Due to the planarization, the top ends of through-conductors 32 are substantially level (coplanar) with the top surfaces of metal pillars 46, and are substantially coplanar with the top surface of encapsulating material 52.

Figure 7:
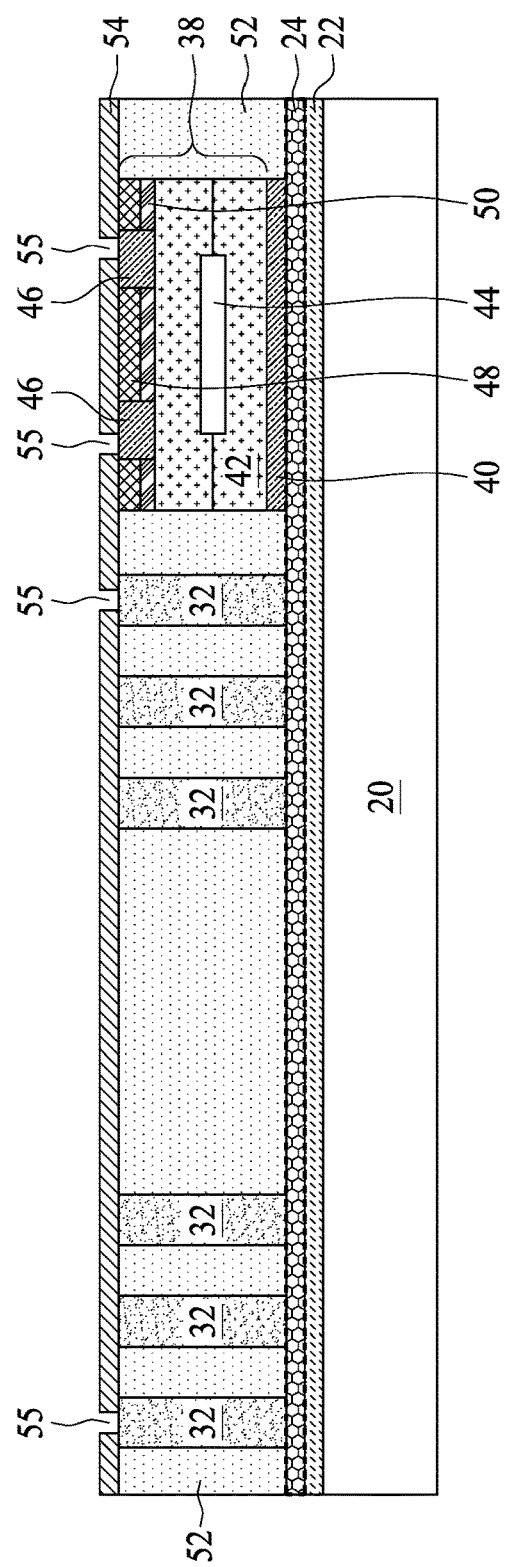

FIGS. 7 through 11 illustrate the formation of front-side RDLs and the respective dielectric layers. Referring to FIG. 7, dielectric layer 54 is formed. The respective step is shown as step 212 in the process flow shown in FIG. 18. In accordance with some embodiments of the present disclosure, dielectric layer 54 is formed of a polymer such as PBO, polyimide, or the like. In accordance with alternative embodiments of the present disclosure, dielectric layer 54 is formed of an inorganic material such as silicon nitride, silicon oxide, or the like. Openings 55 are formed in dielectric layer 54 (for example, through exposure and development) to expose through-conductors 32 and metal pillars 46. Openings 55 may be formed through a photo lithography process.

Figure 8:
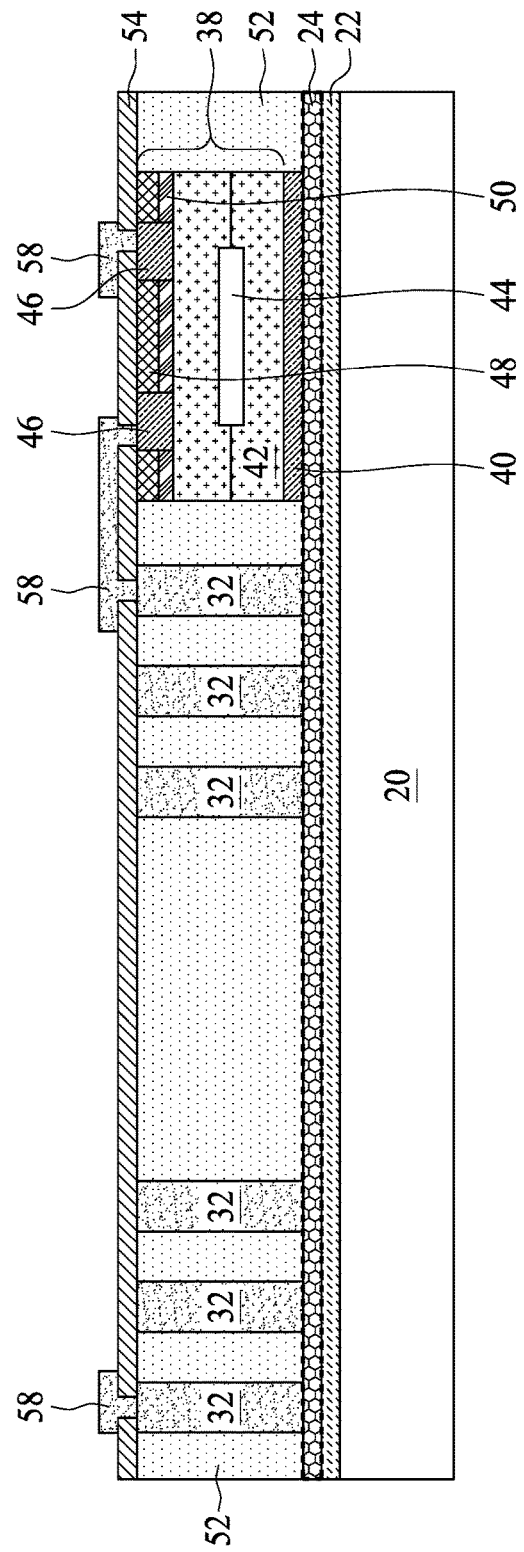

Next, referring to FIG. 8, Redistribution Lines (RDLs) 58 are formed to connect to metal pillars 46 and through-conductors 32. The respective step is shown as step 214 in the process flow shown in FIG. 18. RDLs 58 may also interconnect metal pillars 46 and through-conductors 32. RDLs 58 include metal traces (metal lines) over dielectric layer 54 and vias extending into dielectric layer 54. The vias in RDLs 58 are connected to through-conductors 32 and metal pillars 46. In accordance with some embodiments of the present disclosure, the formation of RDLs 58 includes forming a blanket copper seed layer, forming and patterning a mask layer over the blanket copper seed layer, performing a plating to form RDLs 58, removing the mask layer, and etch the portions of the blanket copper seed layer not covered by RDLs 58. RDLs 58 may be formed of a metal or a metal alloy including aluminum, copper, tungsten, and/or alloys thereof.

Figure 9:
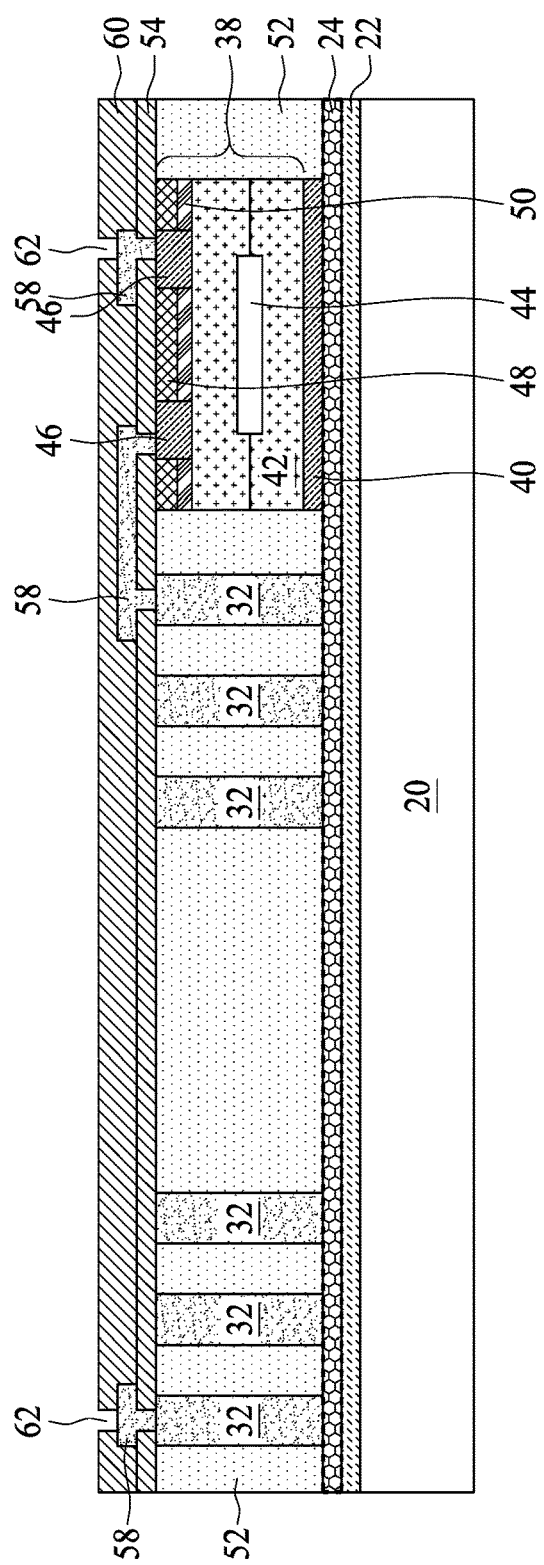

Referring to FIG. 9, in accordance with some embodiments, dielectric layer 60 is formed over the structure shown in FIG. 8, followed by the formation of openings 62 in dielectric layer 60. Some portions of RDLs 58 are thus exposed. The respective step is shown as step 216 in the process flow shown in FIG. 18. Dielectric layer 60 may be formed using a material selected from the same candidate materials for forming dielectric layer 54.

Figure 10:
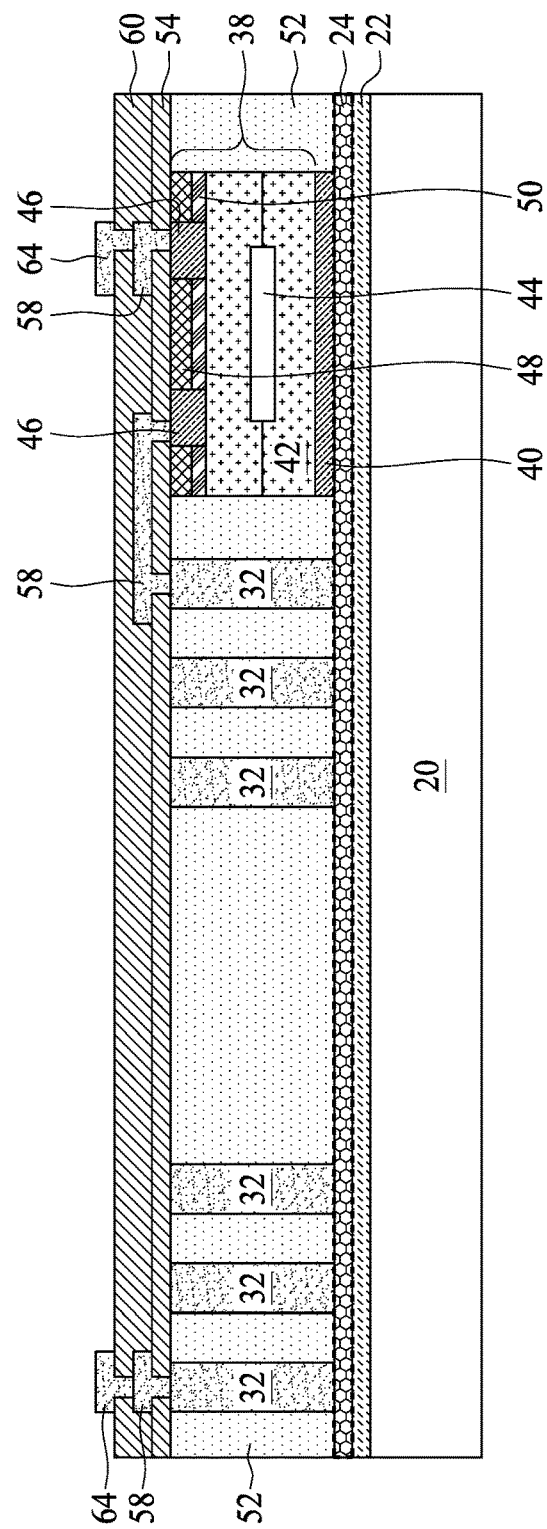

Next, as shown in FIG. 10, RDLs 64 are formed in dielectric layer 60. The respective step is also shown as step 216 in the process flow shown in FIG. 18. In accordance with some embodiments of the present disclosure, the formation of RDLs 64 includes forming a blanket copper seed layer, forming and patterning a mask layer over the blanket copper seed layer, performing a plating to form RDLs 64, removing the mask layer, and etching the portions of the blanket copper seed layer not covered by RDLs 64. RDLs 64 may also be formed of a metal or a metal alloy including aluminum, copper, tungsten, and/or alloys thereof. It is appreciated that although in the illustrated exemplary embodiments, two layers of RDLs (58 and 64) are formed, the RDLs may have any number of layers such as one layer or more than two layers.

Figure 11:
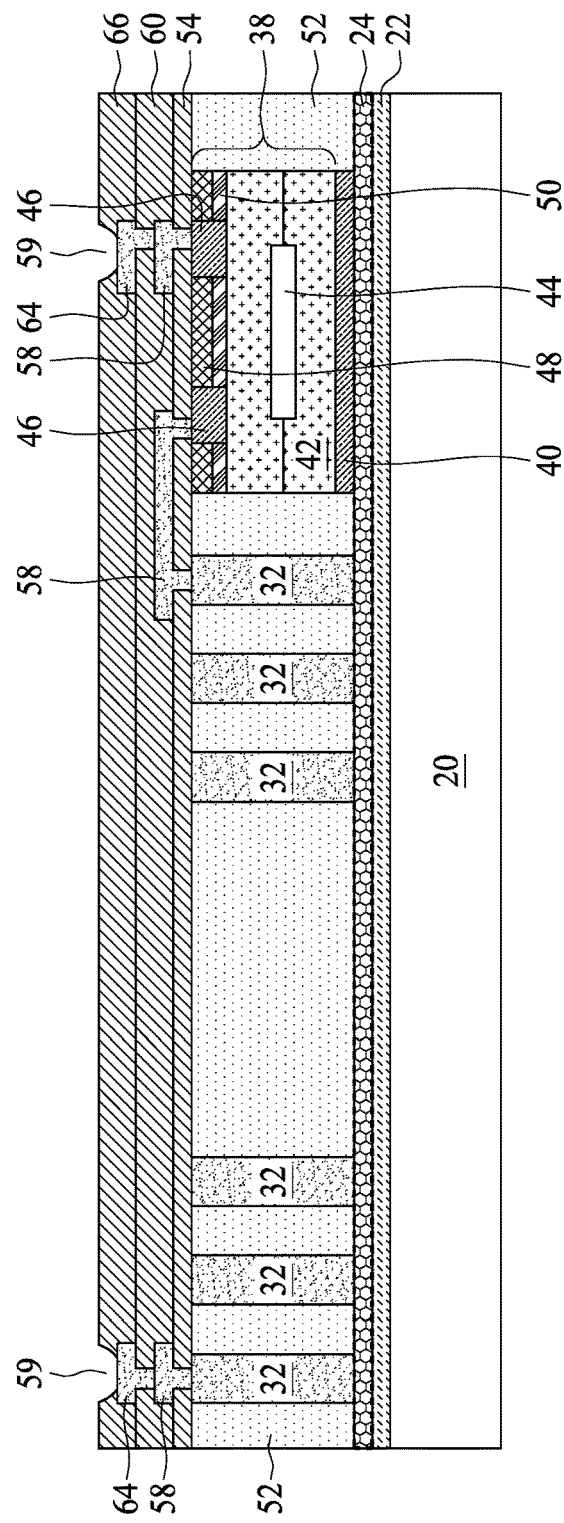
Figure 12:
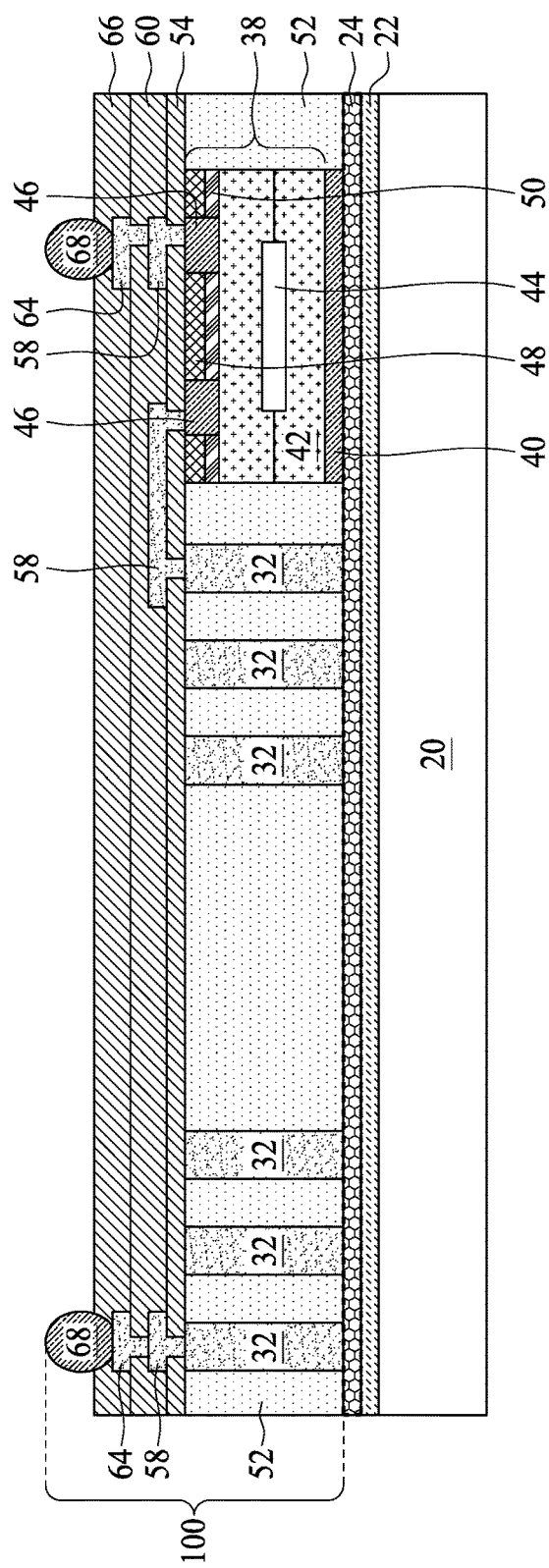

FIGS. 11 and 12 illustrate the formation of dielectric layer 66 and electrical connectors 68 in accordance with some exemplary embodiments. The respective step is shown as step 218 in the process flow shown in FIG. 18. Referring to FIG. 11, dielectric layer 66 is formed, for example, using PBO, polyimide, or BCB. Openings 59 are formed in dielectric layer 66 to expose the underlying metal pads, which are parts of RDLs 64. In accordance with some embodiment, Under-Bump Metallurgies (UBMs, not shown) are formed to extend into opening 59 in dielectric layer 66.

Electrical connectors 68 are then formed, as shown in FIG. 12. The formation of electrical connectors 68 may include placing solder balls on the exposed portions of the UBMs, and then reflowing the solder balls. In accordance with alternative embodiments of the present disclosure, the formation of electrical connectors 68 includes performing a plating step to form solder regions over the exposed metal pads in RDLs 64, and then reflowing the solder regions. Electrical connectors 68 may also include metal pillars, or metal pillars and solder caps, which may also be formed through plating. Throughout the description, the structure including dielectric layer 24 and the overlying structure in combination is referred to as package 100, which is a composite wafer including a plurality of device dies 38.

Next, package 100 is de-bonded from carrier 20, for example, by projecting a UV light or a laser beam on release layer 22, so that release layer 22 decomposes under the heat of the UV light or the laser beam. Package 100 is thus de-bonded from carrier 20. The respective step is shown as step 220 in the process flow shown in FIG. 18. In accordance with some embodiments of the present disclosure, in the resultant package 100, dielectric layer 24 remains as a bottom part of package 100, and protects through-conductors 32. Dielectric layer 24 may be a blanket layer with no through-opening therein. In accordance with alternative embodiments, dielectric layer 24 is not formed, and the bottom surfaces of encapsulating material 52 and through-conductors 32 are exposed after the de-bonding. A backside grinding may (or may not) be performed to remove DAF 40, if it is used, so that the bottom surfaces of through-conductors 32 are coplanar with the bottom surface of device die 38 and the bottom surface of encapsulating material 52. The bottom surface of device die 38 may also be the bottom surface of semiconductor substrate 42.

Figure 13:
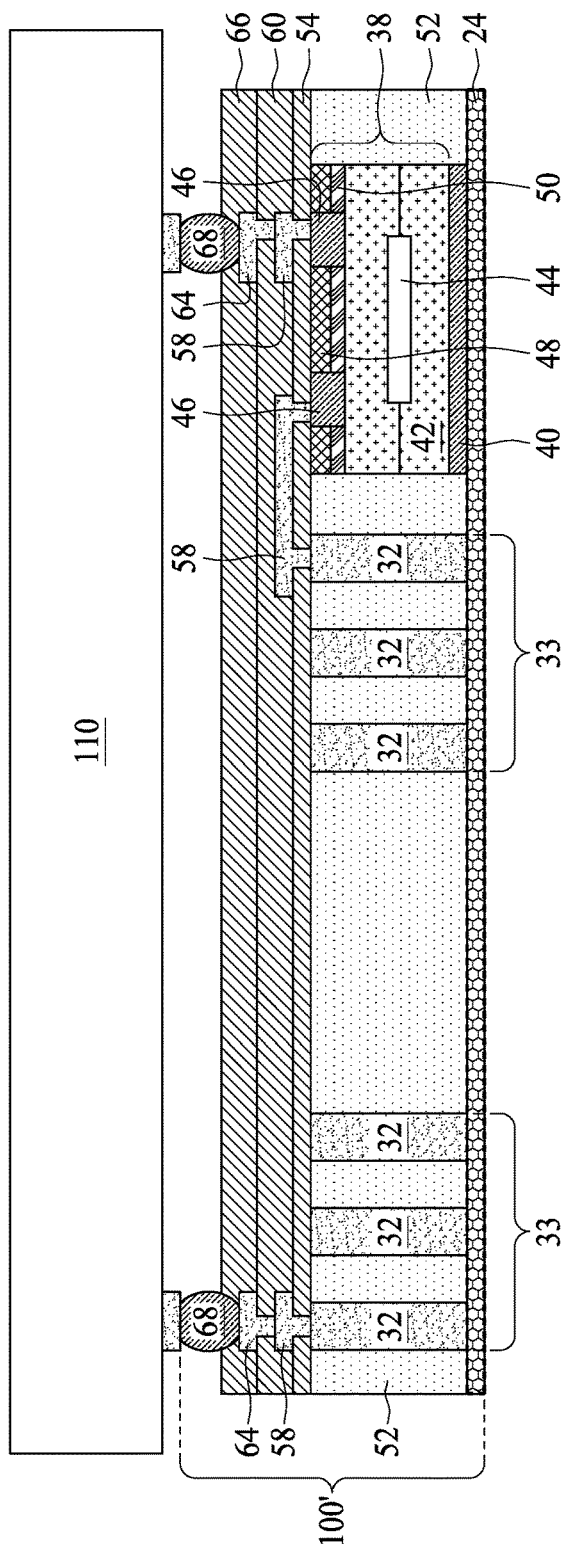

Package 100 is then singulated (sawed) into a plurality of packages 100' that is identical to each other. The respective step is shown as step 222 in the process flow shown in FIG. 18. FIG. 13 illustrates an exemplary package 100'. FIG. 13 also illustrates the bonding of package 100' to package component 110, for example, through electrical connectors 68. Package component 110 may be a Printed Circuit Board (PCB), an interposer, a package substrate, a device package, or the like. In accordance with alternative embodiments, package 100' is electrically connected to a flex PCB (not shown, similar to flex PCB 72 in FIG. 17), which may overlap coil 33, or may be connected sideways.

FIG. 14 illustrates a top view of the package 100' shown in FIG. 13, wherein the cross-sectional view shown in FIG. 13 is obtained from the plane containing line 13-13 in FIG. 14. In accordance with some embodiments of the present disclosure, ports 34 of coil 33 are connected to device die 38 (denoted as 38A), which may be an AC-DC converter die. A BLE die, which is denoted as 38B, is also disposed in package 100' in accordance with some embodiments.

Passive devices 56 are also included in package 100'. Passive devices 56 may be Integrated Passive Devices (IPDs), which are formed on semiconductor substrates in the respective chips. Throughout the description, an IPD may be a single-device chip, which may include a single passive device such as an inductor, a capacitor, a resistor, or the like, with no other passive devices and active devices in the respective chip. Furthermore, in accordance with some embodiments, there are no active devices such as transistors and diodes in the IPDs.

Figure 17:
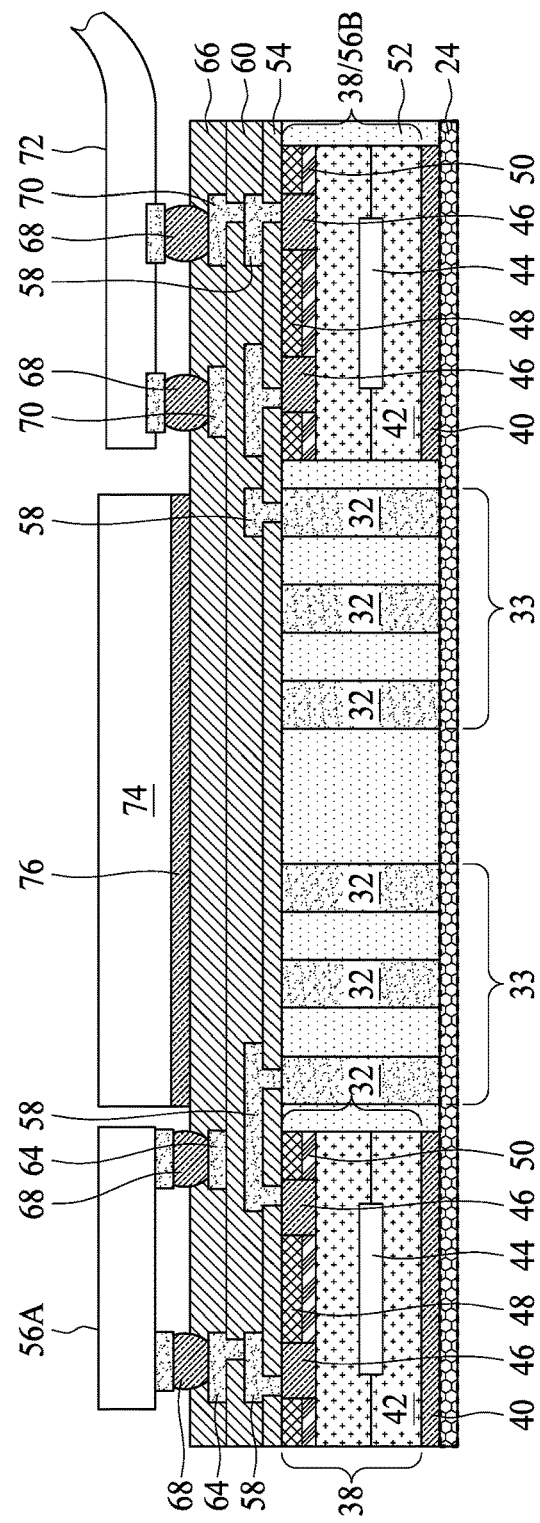
FIG. 17 illustrates a cross-sectional view of a package including a coil, a device die, and an embedded passive device in accordance with some embodiments.

In accordance with some embodiments of the present disclosure, passive devices 56 include Surface Mount Devices (SMDs, denoted as 56A) bonded onto RDLs 64 or solder regions 68, as shown in FIG. 17. In accordance with alternative embodiments, passive devices 56 include embedded passive devices 56B, which may be placed on carrier 20 before the encapsulation step as shown in FIG. 5. The respective passive devices 56B are also shown in FIG. 17, wherein the notation 38/56B indicates that the respective component(s) may be device die 38, passive device (such as an IPD) 56B, or may include both a device die and a passive device that are separate from each other. Similarly, the passive device(s) 56B encapsulated in encapsulating material 52 may have their respective surface conductive features (similar to 46) exposed in the planarization step as shown in FIG. 6. Accordingly, passive devices 56B are electrically coupled to other devices through RDLs 58 and/or 64. In accordance with alternative embodiments, there is no passive device encapsulated in encapsulating material 52.

Referring back to FIG. 14, in accordance with some embodiments of the present disclosure, the portion of encapsulating material 52 encircled by coil 33 does not have any conductive material such as through-vias therein. Accordingly, the portion of encapsulating material 52 encircled by coil 33 also may not have any passive or active device therein.

FIG. 14 also illustrates bond pads 70, which are used for connecting the components in package 100' to a flex PCB 72 (not shown in FIG. 14, refer to FIG. 17) in accordance with some exemplary embodiments. Bond pads 70 are electrically coupled to device die 38A, device die 38B, and/or passive devices 56 through RDLs 58 and 64 (FIG. 13).

Figure 15:
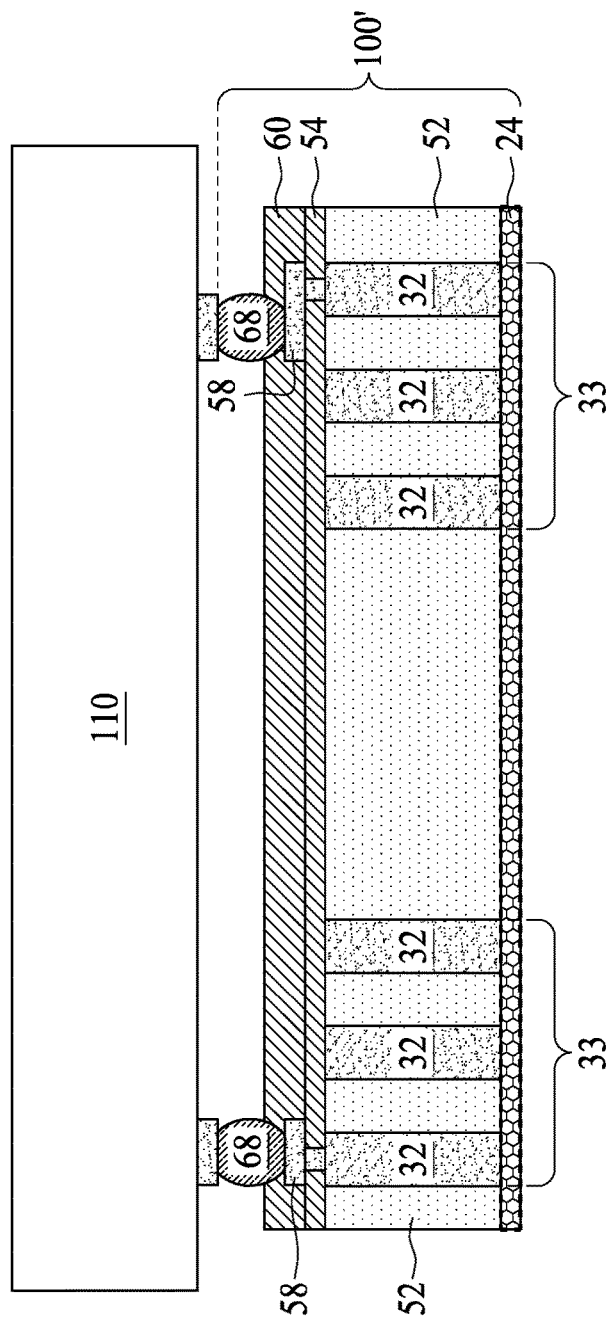
FIG. 15 illustrates a cross-sectional view of a package including a coil and no device die in accordance with some embodiments.

FIG. 15 illustrates a cross-sectional view of a package in accordance with some embodiments of the present disclosure. These embodiments are similar to the embodiments in FIGS. 13 and 14, except no device die (having active devices) and passive device are located in package 100'. Alternatively stated, in accordance with some embodiments of the present disclosure, all conductive features inside encapsulating material 52 are the parts of coil 33. Accordingly, package 100' includes coil 33 and the respective electrical connection structures, but no additional devices, and package 100' is a discrete coil.

FIG. 16 illustrates a top view of package 100' in accordance with some embodiments of the present disclosure, wherein the cross-sectional view shown in FIG. 15 is obtained from the plane containing line 15-15 in FIG. 16. As shown in FIG. 16, coil 33 extends to proximal all edges of package 100', except some process margin is left to ensure an adequate, but not excessive, amount of encapsulating material 52 is on the outer sides of coil 33. As a result, the footprint size (the top-view area) of package 100' is minimized. The portions of encapsulating material 52 on the outer sides of coil 33 prevent coil 33 from being exposed to open air. As shown in FIG. 16, there is no active and passive device inside or outside coil 33 and in encapsulating material 52.

FIG. 17 illustrates a cross-sectional view of package 100' in accordance with some embodiments. As shown in FIG. 17, passive device 56A is over dielectric layers 54, 60, and 66, and may be bonded to metal pads 64 through solder regions 68. Device die 38 and/or passive device 56B are embedded in encapsulating material 52. Flex PCB 72 is connected to metal pads 70, for example, through solder regions 68. Furthermore, passive device 56A may directly overlap passive device 56B to better use the package area and to reduce the footprint of the resulting package.

In accordance with some embodiments, ferrite material 74 is attached to dielectric layer 66 through, for example, adhesive film 76. Ferrite material 74 may include manganese-zinc, nickel-zinc, or the like. Ferrite material 74 has comparatively low losses at high frequencies, and is used to increase the inductance of inductor 33. Ferrite material 74 overlaps coil 33, and the edges of ferrite material 74 may be substantially co-terminus with the edges of coil 33.

Figure 19:
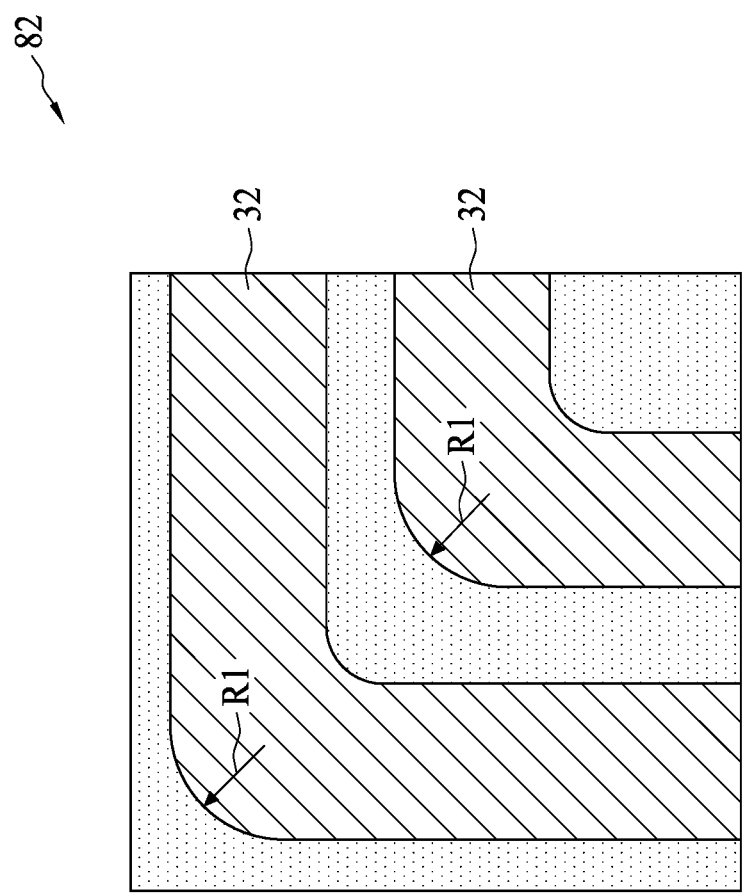
FIG. 19 illustrates a portion of the coil in accordance with some embodiments.

FIG. 19 illustrates an amplified view of portion 82 of package 100' in FIGS. 14 and 16, wherein two through-conductors 32 are illustrated as an example. To reduce stress, through-conductors 32 may have rounded corners. For example, the radius R1 of through conductors may be in the range between about W1/2 and 2W1/3.

To enhance the efficiency, the outer rings of coil 33 may have widths greater than or equal to the widths of the inner rings in accordance with some embodiments. For example, referring to FIGS. 14 and 16, width W1A, which may be the width of the outmost ring, may be equal to or greater than width W1B of the innermost ring. Ratio W1B/W1A may be in the range between about ½ and about ⅔. Furthermore, from outer rings to the inner rings, the widths of through-conductors 32 may be increasingly reduced or periodically reduced every several rings.

Figure 20:
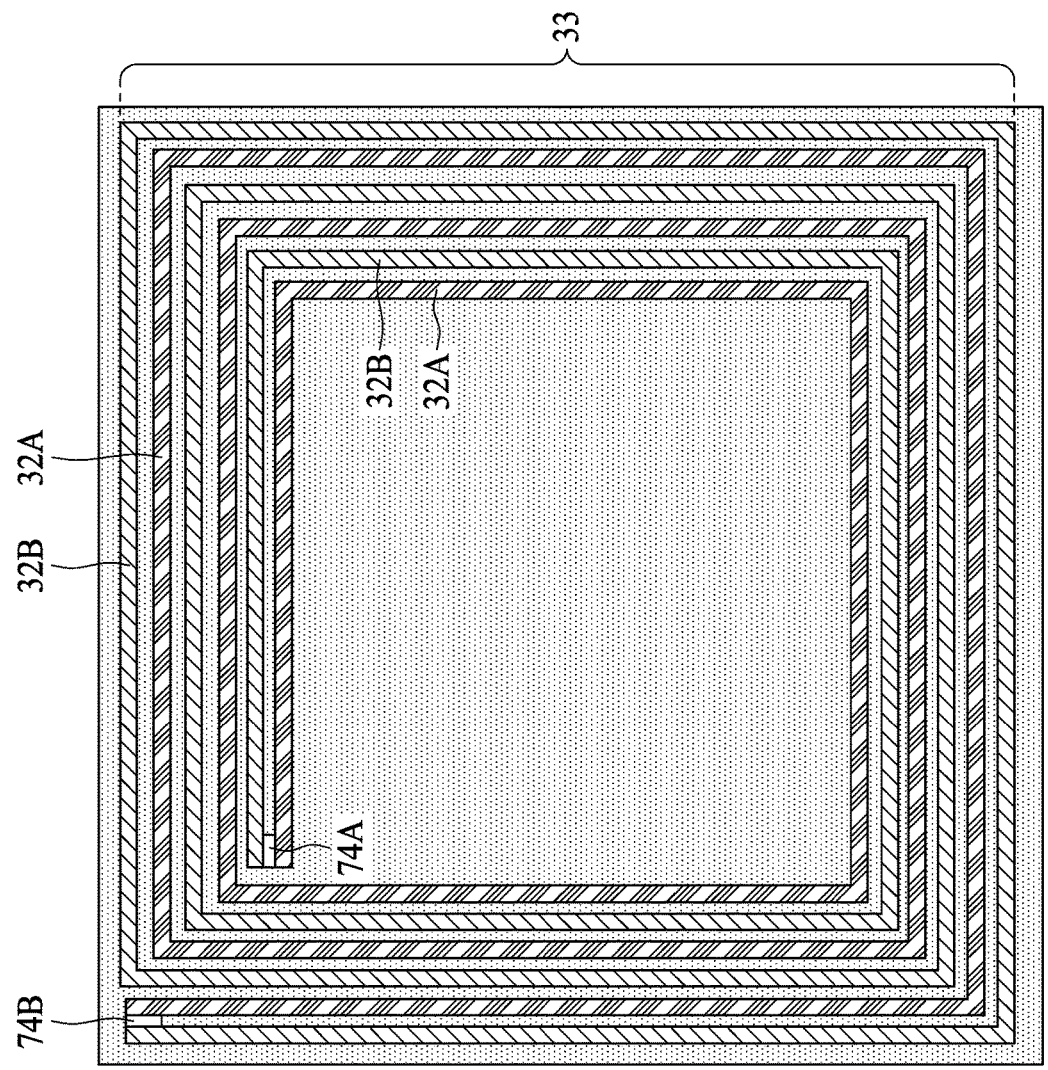
FIG. 20 illustrates a double-line coil in accordance with some embodiments.

FIG. 20 illustrates package 100' including a double-line coil 33 in accordance with some embodiments. For a clearer view, RDLs 58 and 64 (FIG. 14) that connect the ends of coil 33 to device die 38A are not illustrated in FIG. 20. The coil 33 in FIG. 20 may be essentially the same as the corresponding coil in FIG. 14 or FIG. 16, except that coil 33, instead of having a single through-conductor 32 coiling, has two through-conductors 32A and 32B coiling in parallel. Through-conductors 32A and 32B are parallel to each other, and are in combination used like a single conductor to form coil. In order to distinguish through-conductors 32A from 32B, so that their layouts can be clearly seen, through-conductors 32A and 32B are shown using different patterns.

As shown in FIG. 20, each of through-conductors 32A and 32B by itself forms a coil. The ends of through-conductors 32A and 32B are interconnected through connectors 74A and 74B. Each of connectors 74A and 74B may be a through-via formed simultaneously when through-conductors 32A and 32B are formed, or may be a part of RDLs 58 and 64. Connectors 74A and 74B may also include both the through-conductor portion and the RDL portion. In accordance with some embodiments, through-conductors 32A and 32B are only connected at their ends, but not in the middle, as shown in FIG. 20. In accordance with alternative embodiments, additional connectors similar to connectors 74A and 74B may be formed periodically to interconnect the middle portions of through-conductor 32A to the respective middle portions of through-conductor 32A. For example, each straight portion of through-conductors 32A and 32B may include one or more interconnector. The coil 33 as shown in FIGS. 19 and 20 may be combined with all embodiments as illustrated.

As a result of the interconnection of through-conductors 32A and 32B, through-conductors 32A and 32B in combination form the coil. When operated at a high frequency, for example, several megahertz or higher, coil 33 in FIG. 20 has the performance comparable to, and sometimes better than, bulk coil 33 as shown in FIGS. 14 and 16. This may be caused by skin effect. Furthermore, with through-conductors 32A and 32B being narrower compared to a bulk coil since it is equivalent to removing a middle part of through-conductor 32 as shown in FIGS. 14 and 16, the pattern loading effect in the plating of through-conductors 32A and 32B is reduced.

The embodiments of the present disclosure have some advantageous features. Coil 33 is formed in an encapsulating material, and hence the height of coil 33 may have a great value. The inductance of coil 33 is thus high. Coil 33 may also be formed using the same packaging process for packaging device dies, and may be integrated within the same package as device dies and passive devices, resulting in the reduction of footprint and the manufacturing cost of packages.

In accordance with some embodiments of the present disclosure, a method includes forming a coil over a carrier, encapsulating the coil in an encapsulating material, planarizing a top surface of the encapsulating material until the coil is exposed, forming at least one dielectric layer over the encapsulating material and the coil, and forming a plurality of redistribution lines extending into the at least one dielectric layer. The plurality of redistribution lines is electrically coupled to the coil.

In accordance with some embodiments of the present disclosure, a method includes forming a coil over a carrier, wherein in a top view of the coil, the coil comprises outer rings encircling inner rings, encapsulating the coil in an encapsulating material, grinding the encapsulating material, wherein top surfaces of the outer rings and the inner rings of the coil are exposed as a result of the grinding, forming a dielectric layer over the encapsulating material and the coil, and patterning the dielectric layer to form a first opening and a second opening. A first end and a second end of the coil are exposed through the first opening and the second opening, respectively. The method further includes forming electrical connections to electrically couple to the coil.

In accordance with some embodiments of the present disclosure, a structure includes a coil having outer rings encircling inner rings, and an encapsulating material encapsulating the coil therein. The encapsulating material has a top surface coplanar with top surfaces of the outer rings and top surfaces of the inner rings. The structure further includes a dielectric layer over and contacting the encapsulating material and the coil, a first opening and a second opening in the dielectric layer, and a first and a second redistribution line extending into the first opening and the second opening, respectively, to contact opposite ends of the coil.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a coil over a carrier;
    placing a device die over the carrier through an adhesive film;
    encapsulating the coil in an encapsulating material;
    planarizing a top surface of the encapsulating material until the coil is exposed, wherein at a time the planarizing is finished, top surfaces of the device die, the coil, and the encapsulating material are substantially coplanar with each other, and bottom surfaces of the adhesive film, the coil, and the encapsulating material are substantially coplanar with each other;
    forming at least one dielectric layer over the encapsulating material and the coil; and
    forming a plurality of redistribution lines extending into the at least one dielectric layer, wherein the plurality of redistribution lines is electrically coupled to the coil.

2. The method of claim 1, wherein forming the coil further comprises forming a bottom surface of the coil to be substantially coplanar with a bottom surface of the encapsulating material, and no additional conductive feature other than the coil is encapsulated in the encapsulating material.

3. The method of claim 1, wherein the placing the device die comprises placing an AC-DC converter die over the carrier, wherein the AC-DC converter die is encapsulated in the encapsulating material, and wherein the method further comprises electrically coupling the coil to the AC-DC converter die through portions of the plurality of redistribution lines.

4. The method of claim 1 further comprising bonding an integrated passive device over the at least one dielectric layer, wherein the integrated passive device is electrically coupled to the plurality of redistribution lines.

5. The method of claim 1 further comprising attaching a ferrite material to the at least one dielectric layer, wherein the ferrite material overlaps the coil.

6. The method of claim 1 further comprising placing an additional integrated passive device in addition to the coil over the carrier, with the additional integrated passive device being encapsulated in the encapsulating material.

7. The method of claim 1, wherein at the time the planarizing is finished, an entirety of sidewalls of the coil is in contact with the encapsulating material.

8. The method of claim 1, wherein in a top view of the coil, the coil comprises two metal lines joining with each other to form a rounded corner, and a radius of the rounded corner is in a range between about a half of widths of the metal lines and about ⅔ of the widths.

9. A method comprising:
forming a coil over a carrier, wherein in a top view of the coil, the coil comprises outer rings encircling inner rings;
placing a device die over the carrier;
adhering the device die to the carrier through an adhesive film;
encapsulating the coil in an encapsulating material;
grinding the encapsulating material, wherein top surfaces of the outer rings and the inner rings of the coil and a top surface of the device die are exposed as a result of the grinding, and at a time the grinding is finished, a bottom surface of the device die is higher than bottom surfaces of the coil and a bottom surface of the encapsulating material and the bottom surface of the coil, a bottom surface of the adhesive film, and the bottom surface of the encapsulating material are coplanar with each other;
forming a dielectric layer over the encapsulating material and the coil;
patterning the dielectric layer to form a first opening and a second opening, wherein a first end and a second end of the coil are exposed through the first opening and the second opening, respectively; and
forming electrical connections to electrically couple to the coil.

10. The method of claim 9, wherein bottom surfaces of the outer rings and the inner rings of the coil are in contact with an additional dielectric material.

11. The method of claim 9 further comprising performing a singulation to separate the coil into a package, wherein no device die and passive device is in the package.

12. The method of claim 9 further comprising bonding an integrated passive device over the dielectric layer.

13. The method of claim 9, wherein the coil comprises a spiral, and at a time the grinding is finished, an entirety of sidewalls of the spiral is in contact with the encapsulating material.

14. The method of claim 9 further comprising placing an additional integrated passive device in addition to the coil over the carrier, with the additional integrated passive device encapsulated by the encapsulating material.

15. The method of claim 9, wherein the forming the coil comprises:
depositing a seed layer over the carrier;
applying a photo resist over the seed layer;
patterning the photo resist to form at least one opening in the photo resist;
plating a metallic material in the at least one opening; and
etching portions of the seed layer not covered by the coil.

16. A method comprising:
simultaneously encapsulating a coil, an adhesive film, and a device die in an encapsulating material, wherein the adhesive film has a top surface in contact with a bottom surface of the device die;
planarizing the coil, the device die, and the encapsulating material in a planarization step, wherein at a time the planarizing is finished, a top surface of the coil, a top surface of the device die, and a top surface of the encapsulating material are coplanar with each other, and a bottom surface of the coil, a bottom surface of the adhesive film, and a bottom surface of the encapsulating material are coplanar with each other;
forming a plurality of redistribution lines electrically coupling the coil to the device die; and
attaching a ferrite material overlapping the coil.

17. The method of claim 16, wherein the coil is a double-line coil.

18. The method of claim 16, wherein in a top view of the coil, the coil comprises two metal lines joining with each other to form a rounded corner, and a radius of the rounded corner is in a range between about a half of widths of the metal lines and about ⅔ of the widths.

19. The method of claim 9, wherein in a top view of the coil, the coil comprises two metal lines joining with each other to form a rounded corner, and a radius of the rounded corner is in a range between about a half of widths of the metal lines and about ⅔ of the widths.

* * * * *